(12) United States Patent
Kubota et al.

(10) Patent No.: US 8,277,131 B2
(45) Date of Patent: Oct. 2, 2012

(54) SEMICONDUCTOR OPTICAL COMMUNICATION MODULE AND MANUFACTURING METHOD THEREOF

(75) Inventors: Munechika Kubota, Tokyo (JP); Koji Yamada, Tokyo (JP); Keizo Takemasa, Kanagawa (JP); Tomonori Shimamura, Tokyo (JP); Satoshi Sasaki, Saitama (JP); Xiang Yu, Tokyo (JP); Kouyu Moriya, Tokyo (JP); Takashi Sugiyama, Tokyo (JP)

(73) Assignee: Lapis Semiconductor Co., Ltd. (JP)

( * ) Notice: Subject to any disclaimer, the term of this patent is extended or adjusted under 35 U.S.C. 154(b) by 184 days.

(21) Appl. No.: 12/659,967

(22) Filed: Mar. 26, 2010

(65) Prior Publication Data

US 2010/0254665 A1  Oct. 7, 2010

(30) Foreign Application Priority Data

Apr. 2, 2009  (JP) .................................. 2009-090354

(51) Int. Cl.
*G02B 6/36* (2006.01)
(52) U.S. Cl. ........................................... 385/88; 372/20
(58) Field of Classification Search .................... 385/88; 372/20
See application file for complete search history.

(56) References Cited

U.S. PATENT DOCUMENTS

| | | | | |
|---|---|---|---|---|
| 5,523,256 A * | 6/1996 | Adachi et al. | .................... | 438/31 |
| 6,400,500 B1 * | 6/2002 | Tidmarsh et al. | ............. | 359/344 |
| 6,480,513 B1 * | 11/2002 | Kapany et al. | .................... | 372/20 |
| 6,563,992 B1 * | 5/2003 | Doyle | ............................ | 385/115 |
| 6,687,278 B1 * | 2/2004 | Mason et al. | ............... | 372/50.22 |
| 6,795,600 B1 * | 9/2004 | Ticknor | ........................... | 385/14 |
| 7,322,754 B2 * | 1/2008 | Wolf et al. | ....................... | 385/93 |
| 2003/0189747 A1 * | 10/2003 | Hayes et al. | .................. | 359/241 |
| 2005/0244111 A1 * | 11/2005 | Wolf et al. | ....................... | 385/93 |
| 2006/0078014 A1 * | 4/2006 | Coriasso et al. | ................ | 372/26 |
| 2006/0092644 A1 * | 5/2006 | Mok et al. | ..................... | 362/327 |
| 2007/0211772 A1 * | 9/2007 | Romano et al. | .................. | 372/20 |
| 2007/0268939 A1 * | 11/2007 | Cattellan et al. | ................ | 372/20 |
| 2008/0298402 A1 * | 12/2008 | Rossi et al. | ...................... | 372/20 |

FOREIGN PATENT DOCUMENTS

JP  2004-184943 A  7/2004

* cited by examiner

*Primary Examiner* — Charlie Peng
*Assistant Examiner* — Peter Radkowski
(74) *Attorney, Agent, or Firm* — Rabin & Berdo, P.C.

(57) ABSTRACT

A semiconductor optical communication module includes a semiconductor chip mounted on a chip carrier and a lens assembly having an end parallel to and facing the front edge of the chip carrier. The semiconductor chip has a front facet oriented at an acute angle to the front edge of the chip carrier. An optical waveguide in the semiconductor chip transmits an optical signal that propagates on an optical axis extending from the front facet of the semiconductor chip to the end of the lens assembly. The optical axis is orthogonal to the end of the lens assembly and the front edge of the chip carrier. The angled mounting of the semiconductor chip on the chip carrier allows the lens assembly to be placed close to the edge of the chip carrier, and to be moved for optical axis adjustment without striking the chip carrier.

11 Claims, 5 Drawing Sheets

SEMICONDUCTOR OPTICAL COMMUNICATION MODULE AND MANUFACTURING METHOD THEREOF

BACKGROUND OF THE INVENTION

1. Field of the Invention

The present invention relates to a semiconductor optical communication module and its manufacturing method.

2. Description of the Related Art

Optical communication systems are steadily improving in capacity and transmission rate. Systems with a 10-Gbps basic transmission rate have been implemented on a commercial basis, and next-generation systems with a 40-Gbps basic transmission rate are approaching commercialization.

These high-bit-rate high-capacity optical communication systems use electroabsorption modulated laser (EML) light sources. Compared with older systems such as directly modulated distributed feedback (DFB) laser systems, an EML optical communication system has advantages of smaller wavelength chirping and longer reach.

In consideration of the growing scale of optical communication systems, however, and for cost reasons, devices providing still longer reach are needed, e.g., forty to eighty kilometers for a 10-Gbps system operating in the 1.55-µm band, and low wavelength chirping has become essential.

To obtain low wavelength chirping, in addition to optimization of the structures of the electroabsorber (EA) and laser diode (LD) it is also necessary to suppress back-reflection at the electroabsorber end facet. If modulated light is reflected back at the electroabsorber end facet, it reenters the laser diode, causing the carrier density and hence the effective refractive index in the active layer of the laser diode to fluctuate. The resulting wavelength chirping in the laser diode, when added to the wavelength chirping in the electroabsorber, degrades the output signal waveform and results in reduced reach.

To suppress back-reflection, the use of a bent waveguide structure has been proposed. Examples of bent waveguides are shown in, for example, Japanese Patent Application Publication No. 2004-184943. In a conventional optical communication module in which the semiconductor chip including the laser diode, electroabsorber, and waveguide is aligned with the edge of the chip carrier on which the chip is mounted, a bent waveguide requires the lens assembly that receives the modulated light to be placed at angle to the chip carrier, the angle being determined by Snell's law. This angle between the chip carrier and the lens assembly has the unwanted effect of increasing the size of the optical communication module.

Another unwanted effect of the angle between the chip carrier and the lens assembly is that if moved for optical axis adjustment, the lens assembly may strike the end of the chip carrier.

SUMMARY OF THE INVENTION

A general object of the present invention is to reduce the size of a semiconductor optical communication module.

A more specific object is to reduce the size of a semiconductor optical communication module having a bent waveguide.

Another object is to simplify the assembly of a semiconductor optical communication module.

The invention provides a semiconductor optical communication module including a carrier having an edge, a lens assembly having an end parallel to and facing the edge of the carrier, and a semiconductor chip mounted on the carrier. The semiconductor chip has a front facet oriented at an acute angle to the edge of the carrier. An optical waveguide in the semiconductor chip transmits an optical signal that propagates on an optical axis extending from the front facet of the semiconductor chip to the end of the lens assembly. The optical axis is orthogonal to the end of the lens assembly and the edge of the carrier.

The optical waveguide may be bent. The semiconductor chip may also include a light emitting element such as a laser diode that generates the optical signal. The semiconductor chip may further include a modulating element such as an electroabsorber that modulates the optical signal. The modulating element may be electrically connected to a signal line on the carrier. The semiconductor chip may be oriented so that its front facet is closer to the signal line than its rear facet.

The above semiconductor optical communication module is small because the end of the lens assembly can by placed close to the edge of the carrier.

When the lens assembly is moved to align its optical axis it moves parallel to the edge of the carrier, so there is no risk of contact between the lens assembly and carrier.

DETAILED DESCRIPTION OF THE INVENTION

Figure 1:
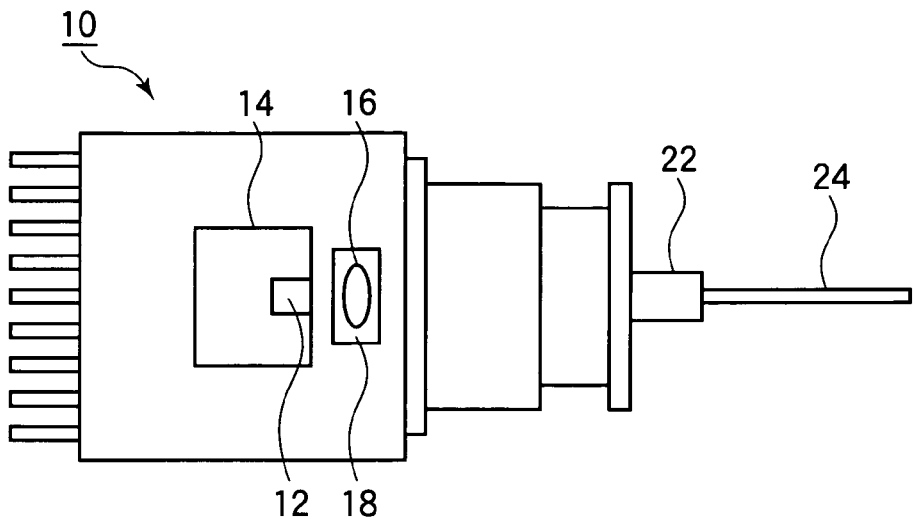
FIG. 1 is a plan view illustrating the general structure of the semiconductor optical communication module in the present invention.

Embodiments of the invention will now be described with reference to the attached drawings, in which like elements are indicated by like reference characters.

First Embodiment

Referring to FIG. 1, the first embodiment is a semiconductor optical communication module 10 having an electroabsorption modulated laser chip-on-carrier (EML-CoC) 12 mounted on a thermoelectric cooler (TEC) 14, a lens 16 mounted on a lens mount 18, an isolator 22, and an optical fiber 24 linked to the isolator 22 to transmit a modulated optical signal. The thermoelectric cooler 14 controls the temperature of the EML-CoC 12. Modulated light output from the EML-CoC 12 is collimated by the lens 16 and transmitted through the isolator 22 into the optical fiber 24.

The lens 16, isolator 22, and optical fiber 24 are shown as a lens assembly 42 in FIGS. 2 to 5. Reference numeral 12 in these drawings points specifically to the chip carrier part of the EML-CoC.

Figure 2:
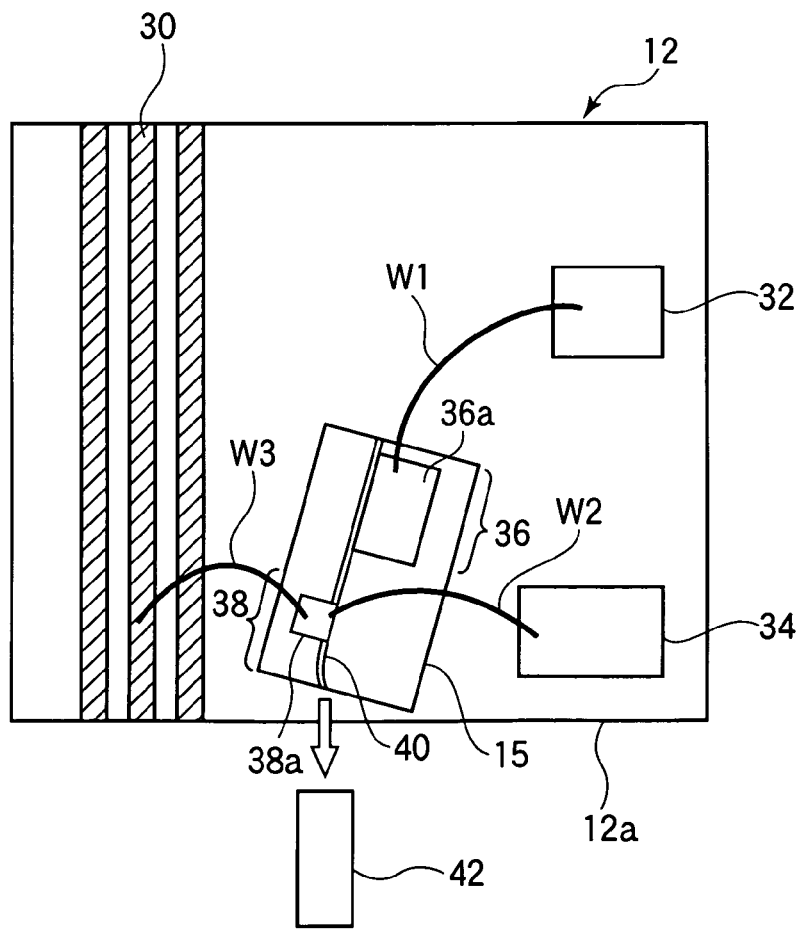
FIG. 2 is a plan view illustrating the more detailed structure of the semiconductor chip and carrier in a first embodiment of the invention.
Figure 3:
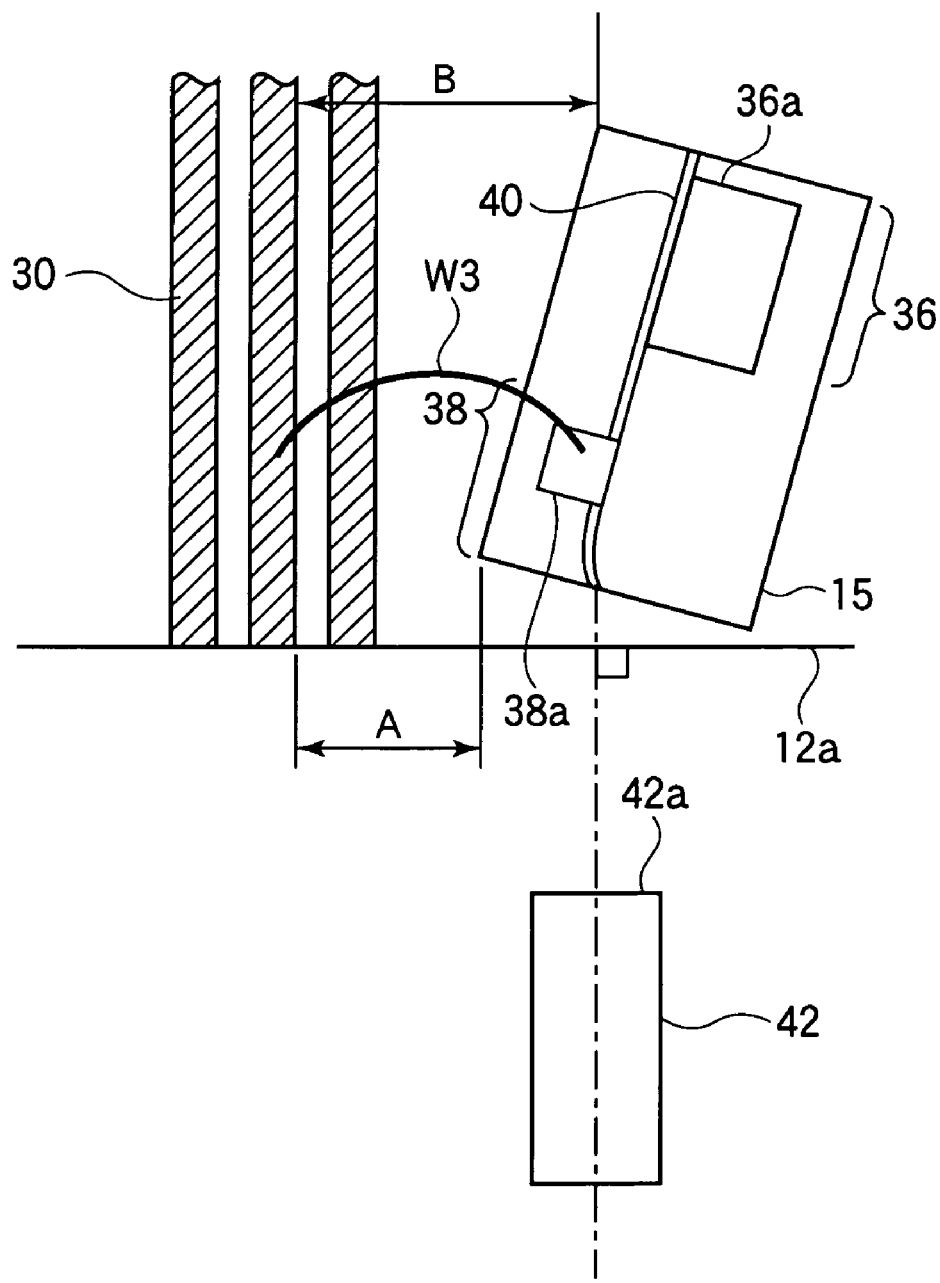
FIG. 3 is an enlarged view of part of FIG. 2.

As shown in FIGS. 2 and 3, the EML-CoC 12 includes a semiconductor chip, more specifically an electroabsorption modulated laser (EML) chip 15, a high-frequency signal line 30, more specifically a coplanar stripline, a pad 32 for supplying current to a semiconductor laser diode 36 in the EML chip 15, and a termination resistor 34 for impedance matching.

Besides including the laser diode 36, the EML chip 15 includes an electroabsorber 38. The electroabsorber 38 modulates light emitted from the laser diode 36 into a bent waveguide 40 running through the laser diode 36 and the electroabsorber 38. The laser diode 36, electroabsorber 38, and bent waveguide 40 are integrated into a single semiconductor substrate covered by a silicon dioxide passivation film (not shown).

Electrode pads 36a, 38a for the laser diode 36 and electroabsorber 38 are formed on the surface of the EML chip 15. The laser diode 36 is connected by a wire W1 to pad 32, and the electroabsorber 38 is connected by wires W2 and W3 to the termination resistor 34 and high-frequency signal line 30, respectively.

The bent waveguide 40 formed in the EML chip 15 meets the major light emitting facet or front facet of the EML chip 15 at an acute angle instead of a right angle. The EML chip 15 is mounted at an angle in the EML-CoC 12 such that the front facet of the EML chip 15 is at an acute angle to the adjacent edge 12a of the chip carrier. The entrance end 42a of the lens assembly 42 is parallel to this chip carrier edge 12a. The EML chip 15 is mounted on the chip carrier 12 at an angle such that light emitted from the bent waveguide 40 on the EML chip 15 propagates on an axis normal to the entrance end 42a of the lens assembly 42. The angle between the entrance end 42a of the lens assembly 42 and the front facet of the EML chip 15 is determined by Snell's law.

Continuous current is injected into the laser diode 36 through wire W1, causing the laser diode 36 to lase and emit continuous wave (CW) light. A 40-GHz electrical modulating signal, for example, is supplied from the high-frequency signal line 30 to electrode pad 38a through wire W3 to control the electroabsorber 38. When the CW light from the laser diode 36 enters the electroabsorber 38, the 40-GHz electrical signal is converted by the electroabsorbing effect of the electroabsorber 38 to a 40-Gbps modulated optical signal.

In this embodiment, the EML chip 15 is mounted so that the distance A between the high-frequency signal line 30 and the front facet of the EML chip 15, i.e., the end facet near the electroabsorber 38, is shorter than the distance B between the high-frequency signal line 30 and the rear facet near the laser diode 36 (A<B). The length L1 of the wire W3 for supplying the electric signal from the high-frequency signal line 30 to the electroabsorber 38 may be, for example, 300 μm.

The angled arrangement of the EML chip 15 and parallel arrangement of the entrance end 42a of the lens assembly 42 in relation to the chip carrier edge 12a can minimize the increase in the size of the optical communication module when a bent waveguide structure is employed. A parallel arrangement of the EML chip 15 and angled arrangement of the entrance end 42a of the lens assembly 42, as in the prior art, produces a greater increase in module size.

After the EML-CoC 12 is assembled by mounting the EML chip 15 on the chip carrier, the optical axes of the EML-CoC 12 and lens assembly 42 are aligned. First, the EML-CoC 12 is mounted on the thermoelectric cooler 14. Next the optical fiber 24 is positioned to obtain maximum optical coupling efficiency with the EML-CoC 12, thereby aligning the optical axis of the optical fiber 24 with the end of the waveguide 40 on the front facet of the EML chip 15. Finally, the lens mount 18, including the lens 16, is inserted and positioned to obtain maximum coupling efficiency, thereby aligning the optical axis of the lens 16 with the optical axis of the optical fiber 24.

As described above, in this embodiment, the direction of the modulated light, indicated by an arrow in FIG. 2, is normal to the front edge 12a of the chip carrier, which facilitates the coupling or alignment of the optical axis of the lens assembly 42 with the optical axis of the EML-CoC 12. In an X-Y-Z coordinate system in which the optical axis of the lens assembly 42 extends in the Z direction and the lens surface extends in the X and Y directions, orthogonal to the Z axis, the lens assembly 42 can be moved in the X or Y direction for optical axis adjustment without the risk of contact between the lens assembly 42 and the chip carrier.

Second Embodiment

A second embodiment will now be described for comparative purposes. The overall structure of the semiconductor optical communication module 10 is the same as in the first embodiment, shown in FIG. 1.

Figure 4:
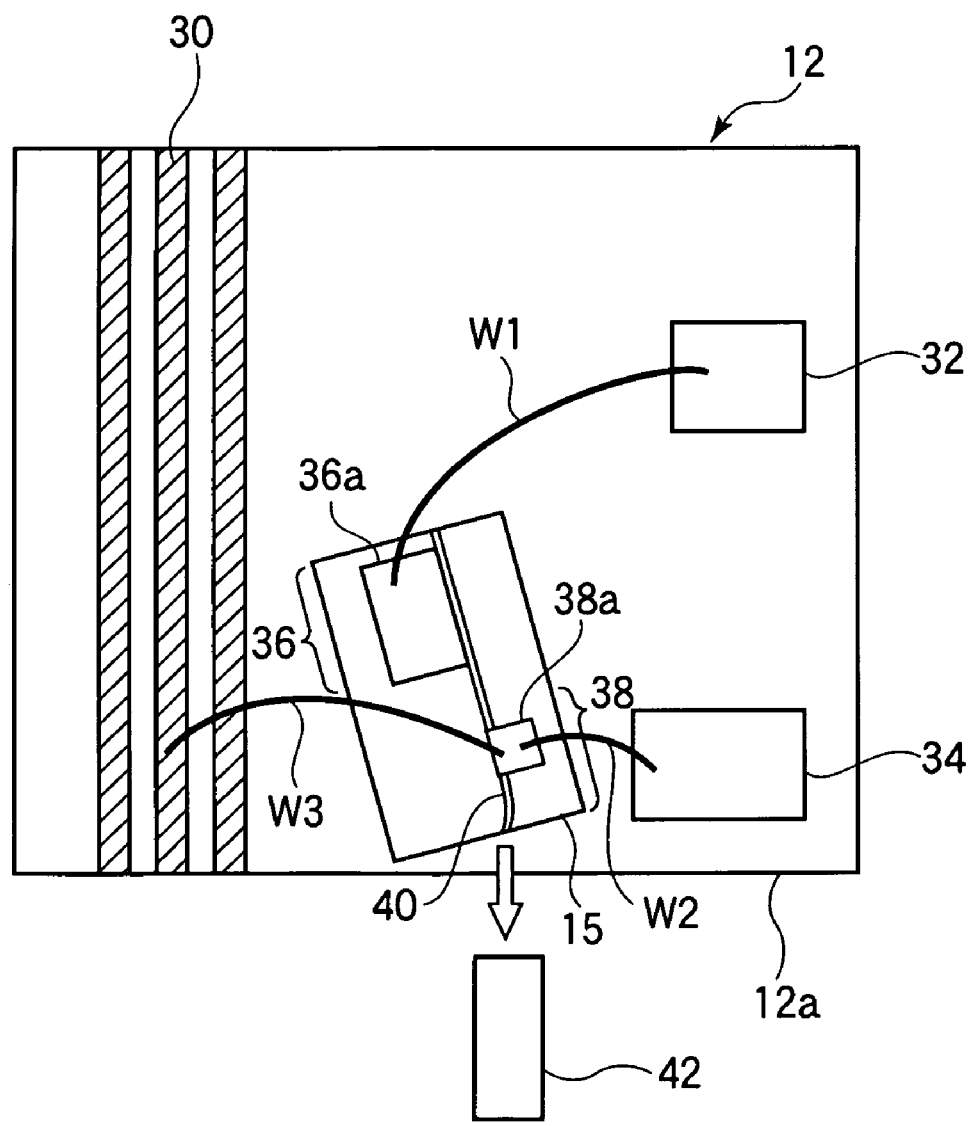
FIG. 4 is a plan view illustrating the more detailed structure of the semiconductor chip and carrier in a second embodiment of the invention.
Figure 5:
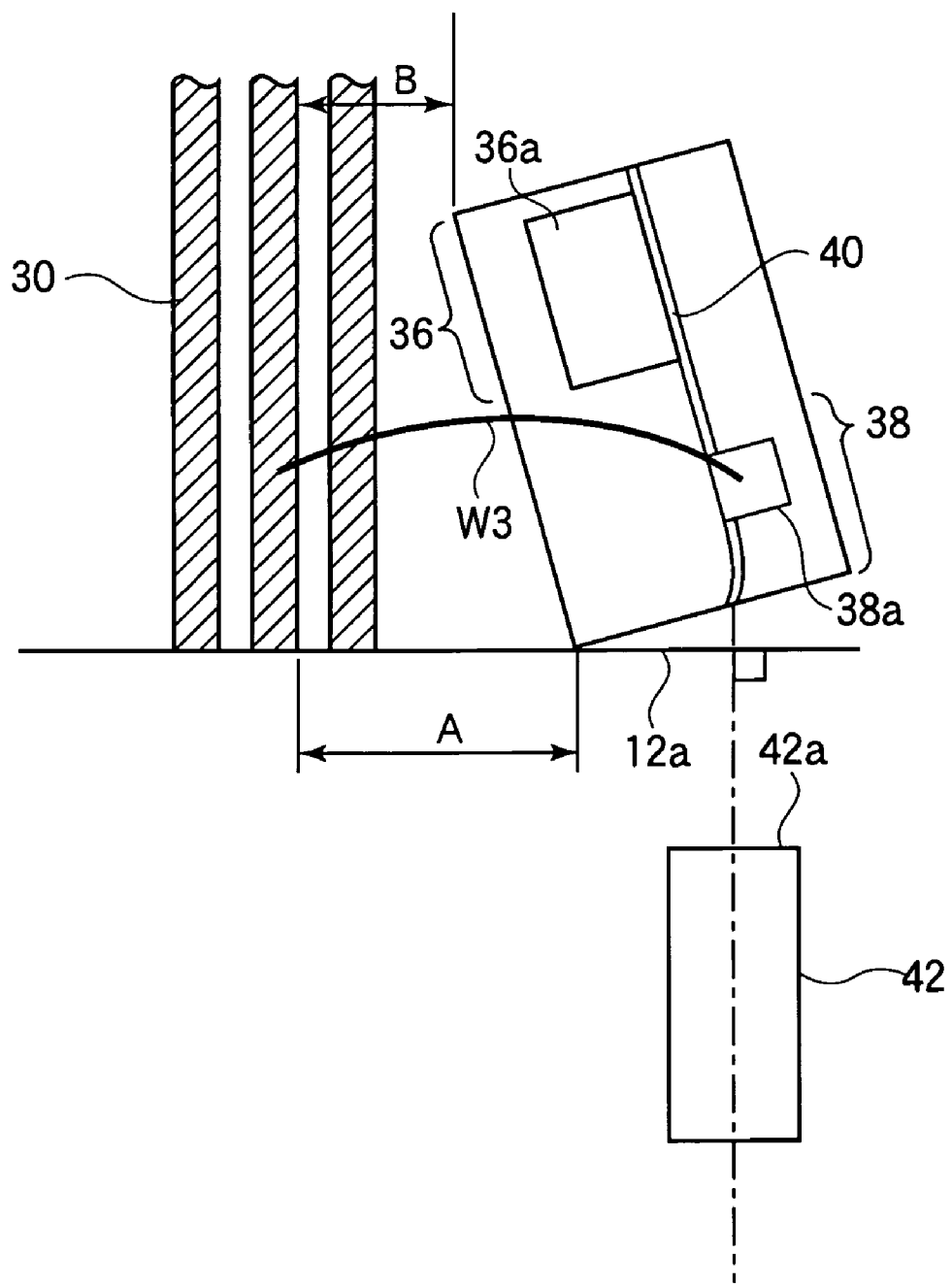
FIG. 5 is an enlarged view of part of FIG. 4.

The structure of the EML-CoC 12 in the second embodiment is illustrated in FIGS. 4 and 5. As in the first embodiment, the entrance end 42a of the lens assembly 42 is parallel to the carrier edge 12a of the EML-CoC 12, but the bend of the waveguide 40 and the angle at which the EML chip 15 is placed are opposite to the bend and angle in the first embodiment.

In the second embodiment, the EML chip 15 is mounted so that the distance (A) between the high-frequency signal line 30 and the front facet of the EML chip 15 is greater than the distance (B) between the high-frequency signal line 30 and the rear facet of the EML chip 15 (A>B). Accordingly, the length L1 of the wire W3 for supplying the electric modulating signal from the high-frequency signal line 30 to the electroabsorber 38 is greater than in the first embodiment, e.g., 600 μm instead of the exemplary 300 μm noted in the first embodiment. The length of wire W3 has an effect on the overall impedance of the EML-CoC device, including the EML chip 15, the termination resistor 34, and other elements, and impacts the high-frequency characteristics of the device.

The second embodiment also differs from the first embodiment in that the electrode pad 36a of the laser diode 36 is located between the bent waveguide 40 and the high-frequency signal line 30.

Figure 6:
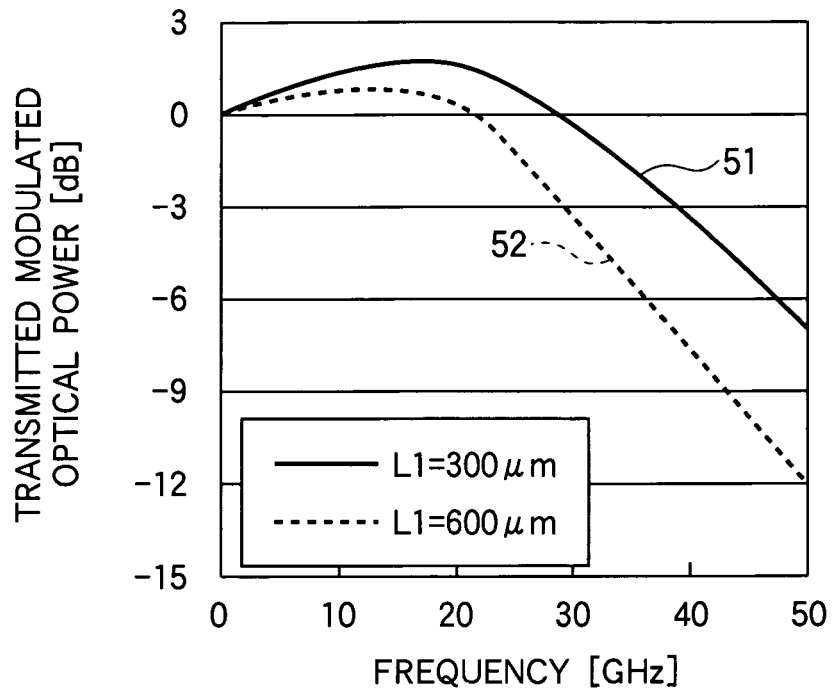
FIGS. 6 and 7 are graphs illustrating effects of the invention.
Figure 7:
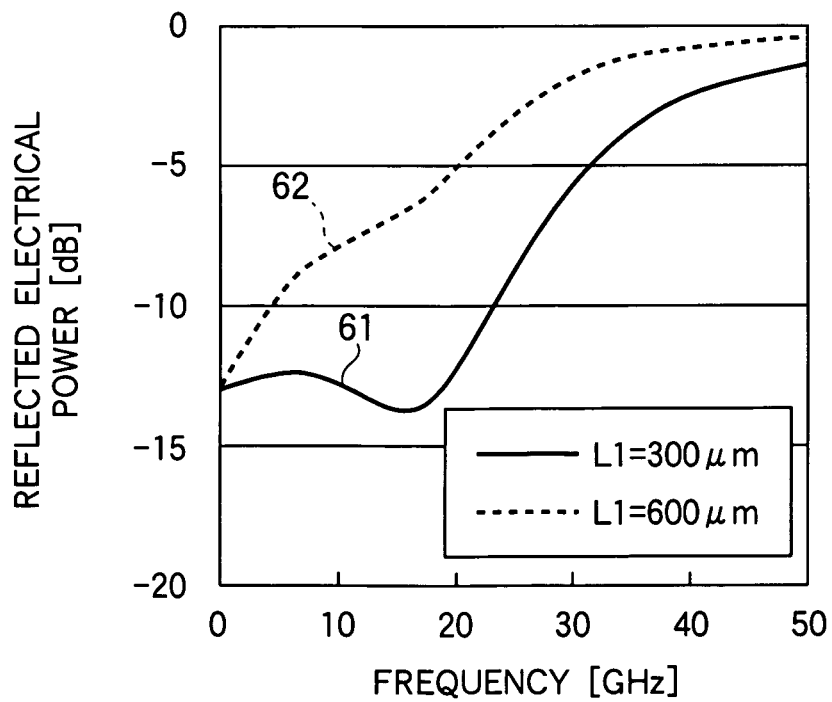

The effects of the invention on optical transmittance and electrical reflectance characteristics will be described with reference to the graphs in FIGS. 6 and 7. It will be assumed that in the first embodiment, wire W3 has a length L1 of 300 μm and an inductance is 0.3 nH, whereas in the second embodiment, wire W3 has a length L1 of 600 μm and an inductance of 0.6 nH. In FIGS. 6 and 7, characteristics calculated for the first embodiment are depicted by solid lines and characteristics calculated for the second embodiment are depicted by dashed lines.

FIG. 6 illustrates optical transmittance as a function of frequency. The three-decibel bandwidth, that is, the frequency at which the transmitted optical power drops to half the power transmitted at a frequency of zero Hz, is often used as a performance index. The curve 51 for the first embodiment shows a three-decibel bandwidth of about 40 GHz. The curve 52 for the second embodiment shows a three-decibel bandwidth of about 30 GHz. The first embodiment thus gives better performance in terms of optical transmittance vs. frequency.

FIG. 7 illustrates electrical reflectance as a function of frequency. The values indicated by curve 61 for the first embodiment are smaller than the values indicated by curve 62 for the second embodiment. The first embodiment thus also gives better performance in terms of electrical reflectance vs. frequency.

For long-reach communication, the optical transmittance characteristic in FIG. 6 must show small modulation loss even at high frequencies. To obtain 50-Ω impedance, the electrical reflectance characteristic shown in FIG. 7 must also be small, even at high frequencies. The curves in FIGS. 6 and 7 indicate that the first embodiment is advantageous at all frequencies, with the optical transmittance advantage increasing as the signal frequency increases. The first embodiment is therefore particularly advantageous for long-reach communication.

The reason for the advantage of the first embodiment is thought to be that wire W3 is shorter than in the second embodiment. One method of shortening the length L1 of wire W3 is to place the electrode pad 38a of the electroabsorber 38 on the side of the EML chip 15 near the high-frequency signal line 30. Another method is to orient the EML chip 15 so that the distance (A) from the high-frequency signal line 30 to the front facet of the EML chip 15 shorter than the distance (B) from the high-frequency signal line 30 to the rear facet of the EML chip 15. The first embodiment uses both methods.

The invention is not limited to semiconductor optical communication modules with electroabsorption modulated laser chips. The basic idea of orienting the chip at an angle to the edge of the chip carrier is applicable to any semiconductor optical communication module in which light is transmitted between a chip and a lens assembly on an optical axis that makes an acute plan-view angle to the end facet of the chip. The chip may be, for example, a DFB laser diode chip, a semiconductor optical amplifier (SOA) chip, a Mach-Zehnder (MZ) interferometer chip, or a photodiode (PD) chip. The waveguide may be bent or curved in various configurations, or may be a straight waveguide oriented at an acute angle to the end facet.

The coplanar microstrip high-frequency signal line shown in the embodiments may be replaced by various other types of signal lines, depending on the signal frequency and the type of chip and type of carrier.

Those skilled in the art will recognize that further variations are possible within the scope of the invention, which is defined in the appended claims.

What is claimed is:

1. A semiconductor optical communication module comprising:
   a carrier having a first edge and a second edge opposite the first edge;
   a lens assembly having an end parallel to and facing the first edge of the carrier; and
   a semiconductor chip mounted on the carrier, the semiconductor chip including
      a first facet oriented at an acute angle relative to the first edge,
      a second facet opposite the first facet,
      a light emitting element for generating an optical signal,
      a modulating element for modulating the optical signal,
      a connecting optical waveguide for transmitting the optical signal generated by the light emitting element to the modulating element, and
      a bent internal optical waveguide for transmitting the modulated optical signal, the optical signal transmitted from the bent internal optical waveguide propagating on an optical axis extending from the first facet to the end of the lens assembly, the optical axis being orthogonal to the end of the lens assembly and the first edge of the carrier;
   a straight signal line for transmitting an electrical modulating signal, the straight signal line extending from the first edge to the second edge on an upper surface of the carrier, the first facet being closer than the second facet to the signal line; and
   a wire for conducting the modulating signal from the straight signal line to the modulating element.

2. The semiconductor optical communication module of claim 1, wherein the light emitting element is a laser diode.

3. The semiconductor optical communication module of claim 1, wherein the modulating element is an electroabsorber.

4. The semiconductor optical communication module of claim 1, wherein the signal line is a microstrip line.

5. The semiconductor optical communication module of claim 1, wherein the semiconductor chip also includes an electrode pad connected to the wire, for receiving the electrical modulating signal, the electrode pad being disposed between the connecting optical waveguide and the signal line.

6. A method of assembling the semiconductor optical communication module of claim 1, comprising:
   mounting the semiconductor chip on the carrier;
   mounting the carrier and the lens assembly in the semiconductor optical communication module; and
   after mounting the semiconductor chip, the carrier and the lens assembly, moving at least part of the lens assembly to adjust optical axes of the semiconductor chip and the lens assembly.

7. The semiconductor optical communication module of claim 1, wherein the modulating element is disposed closer to the first facet than to the second facet.

8. The semiconductor optical communication module of claim 1, wherein the semiconductor chip is skewed relative to the straight signal line.

9. The semiconductor optical communication module of claim 1, wherein the optical axis is skewed relative to the first facet.

10. The semiconductor optical communication module of claim 1, wherein the bent optical waveguide forms an acute angle with the first facet.

11. The semiconductor optical communication module of claim 1, wherein the first facet is closer than any other facet of the semiconductor chip to the first edge and the lens assembly.

* * * * *